United States Patent
Chang et al.

(10) Patent No.: US 6,950,975 B2
(45) Date of Patent: Sep. 27, 2005

(54) ACCELERATION OF CONVERGENCE RATE WITH VERIFIED BITS IN TURBO DECODING

(75) Inventors: Hykong Chang, Potomac, MD (US); Seok Ho Kim, North Potomac, MD (US)

(73) Assignee: Combasis Technology, Inc., Rockville, MD (US)

( * ) Notice: Subject to any disclaimer, the term of this patent is extended or adjusted under 35 U.S.C. 154(b) by 460 days.

(21) Appl. No.: 10/211,893

(22) Filed: Aug. 2, 2002

(65) Prior Publication Data

US 2003/0028838 A1 Feb. 6, 2003

Related U.S. Application Data

(60) Provisional application No. 60/309,919, filed on Aug. 3, 2001.

(51) Int. Cl.$^7$ .............................................. H03N 13/00
(52) U.S. Cl. ...................................... 714/755; 714/792
(58) Field of Search ................................ 714/752, 755, 714/758, 786, 792, 794, 795–796; 375/341, 262

(56) References Cited

U.S. PATENT DOCUMENTS

| | | | |
|---|---|---|---|
| 6,014,411 A | 1/2000 | Wang | |
| 6,028,897 A | 2/2000 | Wang | |
| 6,044,116 A | 3/2000 | Wang | |
| 6,182,261 B1 | 1/2001 | Haller et al. | |
| 6,252,917 B1 | 6/2001 | Freeman | |
| 6,298,463 B1 | 10/2001 | Bingeman et al. | |
| 6,675,342 B1 * | 1/2004 | Yagyu | ........................ 714/755 |

\* cited by examiner

Primary Examiner—Shelly Chase
(74) Attorney, Agent, or Firm—Roberts Abokhair & Mardula, LLC

(57) ABSTRACT

System and method for accelerating the convergence rate of turbo decoding by verifying bits in data frames whose CRC shows no bit errors. Verified bits are translated to bound nodes on a trellis of nodes representing a sequence of bits of the encoded code block. Verification of all bits signals a stop condition and decoding iterations can be terminated. Further, state transition metrics are limited when a node is adjacent to a bound node, allowing for acceleration of convergence by elimination of impossible state transitions. Also disclosed is a scheme to detect bit errors when the code block contains unframed data or partial data frames. This bit error detection scheme uses a recursive encoder to establish end node status. The end node state determination accelerates convergence rate recognition when incorporated with other stop conditions.

3 Claims, 7 Drawing Sheets

ACCELERATION OF CONVERGENCE RATE WITH VERIFIED BITS IN TURBO DECODING

CROSS REFERENCE TO RELATED APPLICATIONS

This application claims priority under 35 U.S.C. § 119(e) from provisional application No. 60/309,919, filed Aug. 3, 2001. The No. 60/309,919 provisional application is incorporated by reference herein, in its entirety, for all purposes.

FIELD OF INVENTION

The present invention relates generally to decoding schemes for "turbo" codes, a class of codes known for superior error correcting capabilities. More specifically, this invention addresses acceleration of convergence rate and stop condition recognition associated with turbo decoding.

BACKGROUND OF THE INVENTION

Transmitted signals become corrupted by noise due to a variety of factors, for example background noise, noise introduced through transmitter and receiver components, noise introduced through atmospheric transmission conditions, and interference introduced from other transmitters operating interfering carrier frequencies. One approach to solving this problem is to encode the signals with redundant bits of information according to known encoding algorithms prior to transmission and then reconstruct of the signal bit stream using a decoder and error correction logic.

On receipt of the coded signals, the decoder logic reconstructs the parts of a signal that have been irretrievably corrupted due to noise or interference, and further reconstructs the original signal from the redundant information contained in the coding. One such forward error correction system comprises a convolutional coder and a Viterbi decoder. A more recent approach to error correction has evolved around a set of concatenated recursive codes known as "turbo codes".

Due to its outstanding coding gain turbo codes are widely used for channel coding applications, particularly in wireless networks. Turbo decoding is accomplished based on an iterative algorithm. Because of its iterative nature, however, turbo decoding may require a large number of iterations under certain noisy channel conditions. Furthermore, defining the stop condition for these iterations can be complicated in the absence of an explicit error detection mechanism incorporated into turbo codes.

Turbo encoding requires multiple encoding steps where the output of constituent, different encoders is concatenated. Concatenated error correction coding is a sequence of coding in which at least two encoding steps are performed on a data stream. Concatenated coding may be performed in series (i.e., the first encoding is further encoded in a serial fashion) or in parallel (where the original data is subjected to different encoding schemes, run in parallel). The parallel concatenated data are then further processed and combined into a serial stream. The concatenated, encoded output is transmitted to a receiving processor where it is decoded. In the transmission, the encoded data block is subject to interference and error introduction, hence the requirement of an error recovery coding scheme.

A parallel concatenated turbo coding scheme starts with a block of data, comprising multiple data frames, that is encoded with a particular coding scheme resulting in systematic bits and parity bits. Additionally, the original block of data may be rearranged with a permuter. The bits are permuted (re-ordered) so that interference (noise) does not affect adjacent bits in their normal order. This scheme of spreading normally adjacent bits enhances the ability to recover from interference distortions.

The permuted bits are then encoded with the same encoding scheme as that applied to the original data resulting in systematic bits (which may be discarded) and parity bits. The two sets of encoded data are then further processed and merged (interleaved) into a serial bit stream. The complexity of parallel concatenated coding depends on the chosen encoding scheme, and can become significantly complex.

Typical turbo codes employed in communications systems are based on a parallelly concatenated constituent coding (PCCC) scheme. A typical turbo encoder with rate ⅓ is illustrated in FIG. 1. In this scheme two systematic convolutional encoders, outer encoder 10 and inner encoder 20, are parallel concatenated via turbo interleaver 30. In this example a convolutional encoder of constraint length 4 is used as a constituent encoder. The coding rate of the example shown is ⅓. Systematic information from the outer encoder in totality is represented as $x^t{}_0(k)$ 12. The outer encoder also generates informational bits, $y^t{}_0(k)$ 14. Output from the inner encoder is represented as $x^t{}_1(k')$, where k' is an interleaved index, and $y^t{}_1(k)$ (information bits) 24.

Turbo decoding is accomplished by employing two constituent decoders, the outer decoder and the inner decoder, that generate log-likelihood ratios (LLR) called "extrinsic information" and by feeding back the extrinsic information from one decoder to the other decoder iteratively. A functional block diagram of a turbo decoder is illustrated in FIG. 2 where x(k) 212, $y_0(k)$ 214, and $y_1(k)$ 224 represent received samples of the encoder outputs, $x^t{}_0(k)$ 12, $y^t{}_0(k)$ 14, and $y^t{}_1(k)$ 24, respectively (See FIG. 1). As illustrated in FIG. 2, the outer decoder takes on received samples, x(k) 212 and $y_0(k)$ 214, and extrinsic information, e(k) 216, generated by the inner decoder 220 where k denotes the symbol index. Similarly, the inner decoder takes on receive samples, x(k') 222 and $y_1(k)$ 224, and extrinsic information, e(k') 226, generated by the outer decoder 210 where k' denotes the interleaved symbol index. Each time a constituent decoder is run, the extrinsic information is updated for the other decoder and the decoder performance gets enhanced iteratively. One iteration is completed when a single pass of decoding is performed for both the outer decoder 210 and the inner decoder 220. In this implementation, one pass of decoding requires memory accesses to N symbol data either in normal or interleaved order. That is, each pass of decoding requires at least N memory access clocks. The iterative processes ends when a termination state is reached (for example, an acceptable BER has been obtained) or when successive iterations produce little or no improvement in the BER (the process has "converged"). At this point the sample, which is a gray scale value, is passed through hard decision logic 228 where values <0.5 are given a value of 0 and values >0.5 are given a value of 1 resulting in the value of $X_H(k)$ 230.

In order for the decoder processor to decode the encoded input data at the same rate as the input data is arriving, the component decoder processor must process the encoded data at a rate at least as fast as the rate of the incoming data. With iterative decoding, the speed of the decoder processor becomes a significantly limiting factor in the system design. Schemes to accelerate the decoding process include accelerating the decoder and accelerating convergence rate and the recognition of the decoding terminating event. The present invention is concerned with accelerating the convergence rate as well as the recognition of the decoding terminating event.

U.S. Pat. No. 6,182,261 to Haller et al. entitled "Effective Iterative Decoding", describes decoding that uses multiple processors to decode Turbo code in parallel and logic that accelerates recognition of a termination condition. The termination recognition schemes are applied to each processor individually. The logic includes: performing CRC and terminating when the check sum variance gets below some threshold; terminating when the probability that the estimated bit value accuracy has reached a threshold level; terminating when a bit error rate (BER) level is sufficiently low; and several other schemes. The parallel decoding process continues iteratively until the termination logic determines completion of the packet's decoding.

Other termination recognition logic described in Haller include: stopping when a maximum number of iterations have been performed; stopping when output data has consumed some level of storage capacity; and, stopping when the results for the current iteration matches the results for the last prior iteration or matches the results for the last prior two iterations. The latter logic, which is performed only after a minimum number of iterations have been performed, recognizes a termination condition if successive iterations yield the same result, thus concluding that a convergence of the iteration results has been achieved. This type of method is referred to as accelerated convergence rate (ACR) logic.

U.S. Pat. No. 6,298,463 to Bingeman et al., entitled "Parallel Concatenated Convolutional Coding", describes an encoding and decoding scheme that process a group of N bits (as opposed to coding single bits). One embodiment of Bingeman uses a parity bit generator that adds a parity bit to the group of bits encoded, thus allowing the decoder to check parity on small grouping of bits. The preferred embodiment sets N at 2 or 3 bits. Acceleration of termination recognition occurs through use of parity bit checking of a small grouping of bits. This scheme is different than performing CRC, which is a check for the sum of the bits for an entire data frame.

U.S. Pat. No. 6,252,917 to Freeman, entitled "Statistically Multiplexed Turbo Code Decoder", describes a system where a plurality of decoders report the progress of bit error rate convergence of their respective signals being decoded to a centralized scheduler. The scheduler can then analyze each decoder for a terminating condition where the bit error rate has ceased to improve sufficiently to justify continued iterations. Effectively, this patent centralizes some of the decision logic to a scheduler as opposed to a processor that performs the decoding, but does not accelerate recognition of some terminating condition.

U.S. Pat. No. 6,014,411 to Wang (Wang '411), entitled: "Repetitive Turbo Coding Communication Method", describes a method for reduction in error rate of turbo coding (encoding and decoding). Two approaches are described: 1) A backward recursive decoding from all possible end node states so as to eliminate tail bit errors; 2) The use of bit partitioning during encoding by repetitive coding so as to increase Hamming distance and thus increase coding gain. The first aspect provides a turbo decoding method for backward recursion starting from all possible states of a bit as represented on a trellis. The method is applied when the tail bits of a turbo encoded data frame are flushed and parity bits for the flushed bits are added to the encoded data block. In typical turbo code implementations tail bits or flush bits of a turbo code block are generated separately at the end of data bit encoding in such a way that the code trellis terminates at all-zero state. Normally data interleaving for turbo coding is limited to data bits and tail bits for the second encoder are generated independently of tail bits of the first encoder. The method proposed in Wang '411 patent (and the related patents discussed below) performs data interleaving over data and tail bits of the first encoder and does not force the final state of the code trellis of the second encoder to all-zero state.

Two additional patents to Wang, U.S. Pat. Nos. 6,028,897 (Wang '897) and 6,044,116 (Wang '116), are inter-related to Wang '411. The Wang '897 patent abstract describes a backward recursive method to determine an ending state and further includes in the abstract that the tail bits are not flushed. The '411 patent abstract includes a discussion of repetitive encoding and addresses appending parity bits for the tail bit sequence.

The Wang '116 patent description abstract describes a non-flushing method. Further, Wang '116 claims repetitive encoding but not a repetitive systematic data sequence, nor does it describe a sequence of parity tail bits nor flushing tail bits.

The Haller patent and Wang patents, as noted, are examples of logic that attempt to accelerate the convergence rate. The Haller patent does this by recognizing that if the last two (or three) decode iterations yield the same result, it is likely (but not certain) that convergence has occurred. The Wang patents focus on finding a concluding node state on a trellis that represents the actual bit state. This accelerates convergence analysis if the final condition is known before the iteration process starts, thus avoiding analysis that leads down an incorrect path.

While various embodiments of ACR logic have been disclosed in the prior art, these embodiments of ACR logic are not fully optimized. What is desired is ACR logic that accelerates the convergence rate by using knowledge of error-free data frames to identify nodes in a trellis (a "bound node") that are entered by a data bit from such error free frame (a "verified bit") thus avoiding going down incorrect paths from interior node points. It is further desirable to be able to use ACR logic when less than a full data frame is included in the encoded code block.

SUMMARY OF THE INVENTION

As previously noted, turbo decoding is based on an iterative algorithm. The time it takes to decode a turbo encoded data frame is dependent, among other factors, on the rate of convergence and the bit error detection for determining an iteration stop condition. The present invention provides a means to accelerate the convergence rate and at the same time detect bit errors in the decoded bits.

It is therefore an objective of the present invention to provide ACR logic for providing a means to accelerate the convergence rate of turbo decoding in the presence of verified bits in the code block.

It is another objective of the present invention to determine verified bits by checking embedded CRC bits of individual data frames within an encoded code block.

It is still another objective of the present invention to detect bit errors on individual data frames within the code block thus the stop condition for iteration in turbo decoding can be unambiguously defined.

It is still a further objective of the present invention to error detect unframed or partially framed data thus increasing the effectiveness of stop conditions for turbo decoding when incorporated to existing stop conditions.

It is yet another objective of the present invention to use known node parameters to decode adjacent (nearby) nodes.

These and other objectives of the present invention will become apparent from a review of the general and detailed descriptions that follow. The present invention is a system and method of decoding turbo codes comprising one or more data frames in an encoded data block. The present invention accelerates the recognition of a stop condition by checking for the absence of bit errors within a data frame. A CRC for each data frame is established and is input to and known by the decoder. When a CRC is employed for each data frame and is successfully checked out, the decoder marks each of the data frame bits as being verified. Further, the state for each node on a trellis used to represent the decoded bits is marked as bound when it represents a bit in a data frame whose CRC indicates no bit errors exist. An outer decoder performs this analysis and binding.

The bits and corresponding trellis node states are interleaved after outer decoding. An inner decoder then decodes the interleaved order. When bound nodes are present, the inner decoder uses logic that recognizes that the bound nodes are immutable, thus limiting the available transition states possible between bound and unbound nodes. It is noted that the inner decoder decodes bits in an interleaved order, thus presenting the situation where bound and unbound nodes may be adjacent to each other.

After the inner decoder completes a decoding iteration, the results are de-interleaved, that is, the bits are returned to a normal order. Once all the nodes have become bound, no further analysis is necessary and the decoder comprises logic to recognize this state and stop decoding. The traditional convergence logic recognizes that the decoding is complete when an LLR values have reached some acceptable level. In the event that LLR stop condition occurs prior to reaching a fully bound set of nodes, the decoder will stop decoding. It is estimated that the system and method described will result in a significant acceleration in convergence.

In yet another embodiment of the present invention, a terminating node state is predetermined when one or more of the included data frames are partial data frames (or are otherwise unframed). In this embodiment, an encoder is used with the inner and outer decoder to recursively establish a valid terminal node condition for the end node.

DETAILED DESCRIPTION OF THE INVENTION

As previously noted, turbo decoding is based on an iterative algorithm. The time it takes to decode a turbo encoded data frame is dependent, among other factors, on the rate of convergence and the bit error detection for determining an iteration stop condition. The present invention provides a means to accelerate the convergence rate and at the same time to detect bit errors in the decoded bits.

In the present invention, acceleration of convergence is achieved by identifying those data frames, which, based on a CRC analysis, have no bit errors. Bits of an errorless data frame are "verified" bits. A node on a trellis entered by verified bits has a known state metric. Such nodes are "bound" nodes. When the bits are interleaved, a node on the trellis adjacent to a bound node is limited as to what its state metric might be. Using a limited choice metric, an unbound adjacent node's state is projected with greater certainty than without using this knowledge and is done so in fewer interations, thus reducing the time to reach convergence.

Further, by identifying verified bits, the recognition of all nodes being bound is now possible. When all nodes of a trellis are bound, the present invention allows the decoding process to be terminated. Again, the present invention allows for a more efficient means of identifying a stop condition so that the overall efficiency of the decoding process is improved.

Within a constituent decoder a log-MAP (logarithmic maximum a posteriori) algorithm is generally used for decoding. Like Viterbi algorithm the log-MAP algorithm utilizes the notion of state metrics. The log-MAP algorithm, however, requires state metric computations in two directions, forward and backward. A log-MAP algorithm can therefore be broken into two generalized Viterbi processes and an extrinsic information generation function.

Figure 3:
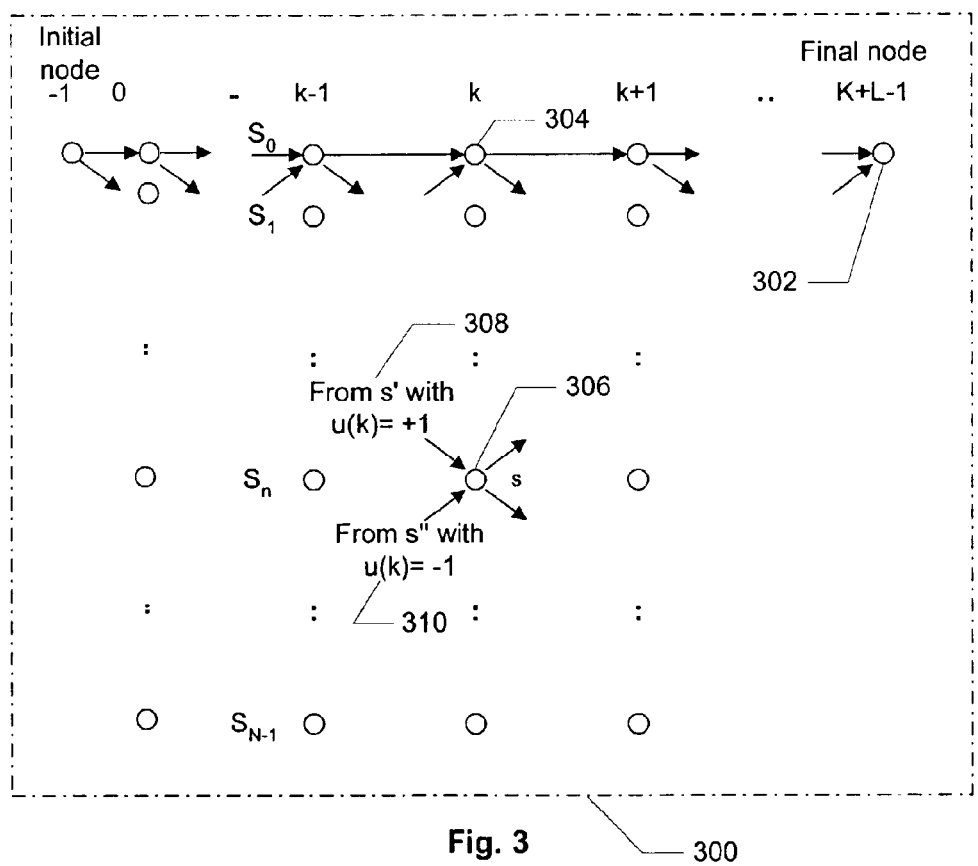
FIG. 3 illustrates a code trellis for constituent decoder.

Referring to FIG. 3, a code trellis for constituent decoder is illustrated. This code trellis diagram assumes a code block size of K with N node states $S_0, S_1, \ldots, S_{N-1}$ 300 as shown, but this is not meant as a limitation. Note that the last L nodes are termination nodes added to the code trellis in order to terminate the code trellis at $S_0$. That is, the decoding scheme, in order to return the node status to $S_0$ at the final node 302, appends "L" termination nodes to the trellis.

To derive state metrics at node k 304, branch metrics need to be defined first as in the Viterbi algorithm. Denoting:

$BM^+(k, s)$: branch metric for state transition s' to s with $u(k)=+1$ $BM^-(k, s)$: branch metric for state transition s" to s with $u(k)=-1$.

$y(k)=[y_0(k), y_1(k), \ldots, y_{P-1}(k)]^T$: receive sample vector corresponding to P encoder output bits for information bit u(k), branch metrics in log-MAP algorithm are defined in terms of the branch metric function u( ) as $$BM^+(k, s) = u(y(k), s' \to s, e(k)) \text{ if } s' \text{ to } s \text{ transition is due to } u(k)=+1$$

$$BM^-(k, s) = u(y(k), s'' \to s, e(k)) \text{ if } s'' \text{ to } s \text{ transition is due to } u(k)=-1.$$

For a given state s 306, there are two transition paths to s 306, s' 308 to s due to u(k)=+1 and s" 310 to s due to u(k)=-1. Denoting $SM_f(k, s)$: forward state metric of state s $SM_b(k, s)$: backward state metric of state s, the recursion process for state metric updating can be described as follows:

Forward Recursion $$SM_f^+(k, s) = SM_f(k-1, s') + BM^+(k, s)$$

$$SM_f^-(k, s) = SM_f(k-1, s'') + BM^-(k, s)$$

$$SM_f(k, s) = \Box(SM_f^+(k, s), SM_f^-(k, s))$$

Backward Recursion $$SM_b^+(k, s) = SM_b(k+1, s') + BM^+(k+1, s')$$

$$SM_b^-(k, s) = SM_b(k+1, s'') + BM^-(k+1, s'')$$

$$SM_b(k, s) = \lambda(SM_b^+(k, s), SM_b^-(k, s))$$

where $\lambda(a, b)$ is a function that combines two incoming state metrics to state s. In full log-MAP algorithm is s defined as:

$$\lambda(a, b) = \log(\exp(a) + \exp(b)).$$

In max log-MAP algorithm the above function is approximated as:

$$\lambda(a, b) = \max(a, b).$$

Note that for a given state transition the backward branch metrics are the same as the forward branch metrics. For the above recursion process the state metrics of the initial and final nodes are initialized as:

$$SM_f(-1, s) = 0 \text{ if } s = S_0, -\infty \text{ otherwise}$$

$$SM_b(K+L-1, s) = 0 \text{ if } s = S_0, -\infty \text{ otherwise}.$$

The extrinsic information generation function is then defined as:

$$e(k) = \lambda(SM^+(k, S_0), SM^+(k, S_1), \ldots, SM^+(k, S_{N-1})) - \lambda(SM^-(k, S_0), SM^-(k, S_1), \ldots, SM^-(k, S_{N-1}))$$

where $$SM^+(k, s) = SM_f^+(k, s) + SM_b(k, s)$$

$$SM^-(k, s) = SM_f^-(k, s) + SM_b(k, s) \text{ and}$$

$\lambda(a, b, c, \ldots)$ is a combining function of all incoming state metrics.
Note that $\lambda(a, b, c, \ldots)$ is a generalized version of $\lambda(a, b)$ defined earlier.

A collection of data frames generated by a number of application modules is sent to a turbo encoder in the form of a continuous bit stream. Each data frame contains CRC (cyclic redundancy check) bits for bit error detection purposes as embedded by an application module. An embodiment of the present invention provides that the turbo decoder has access to a complete set of CRC parameters for each data frame within the code block. Under these circumstances it is possible for the turbo decoder to detect bit errors in individual data frames and exploit the presence of error-free data frames to accelerate the convergence rate of turbo decoding.

Figure 2:
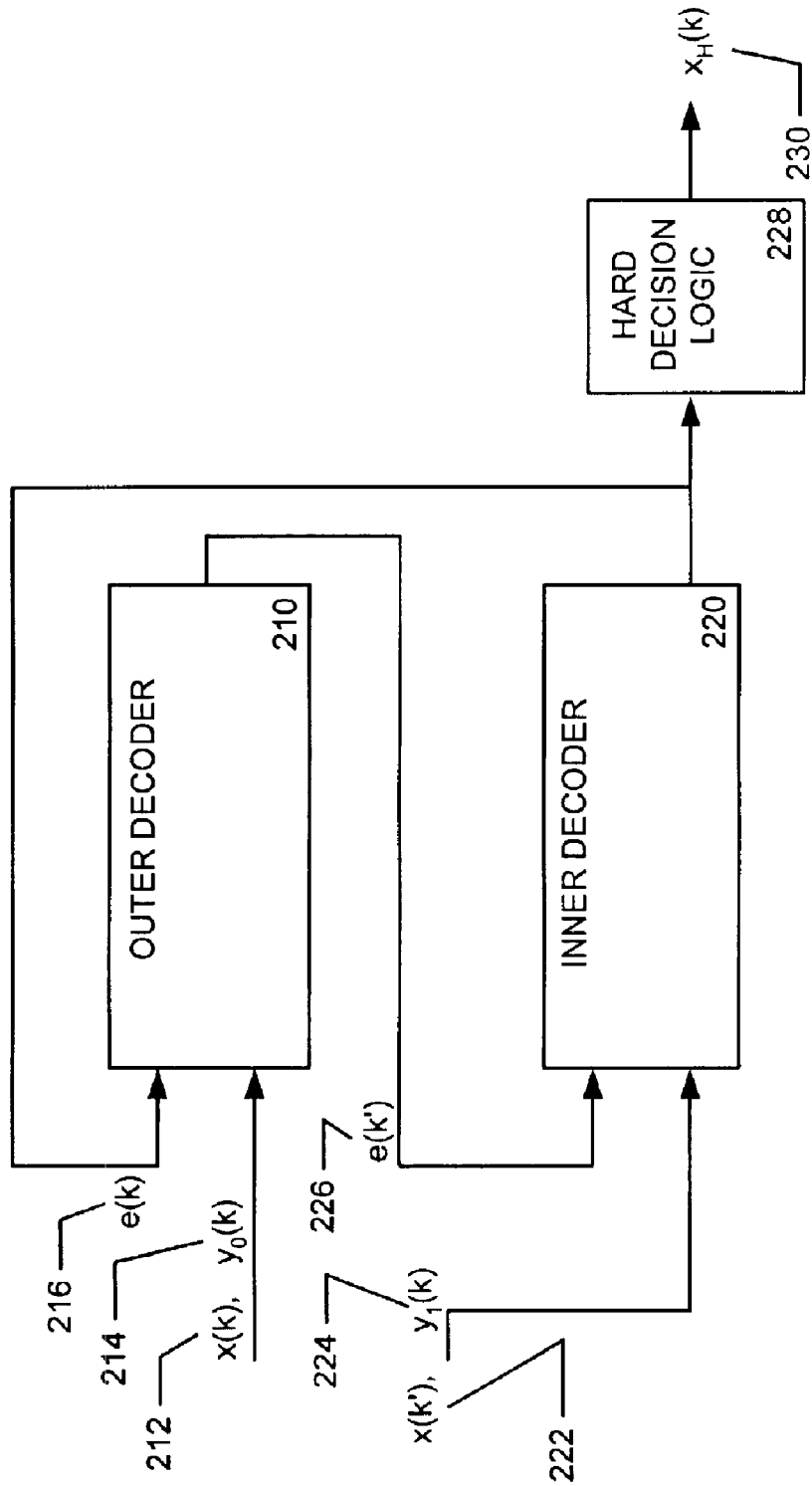
FIG. 2 illustrates a functional block diagram of turbo decoder.
Figure 4A:
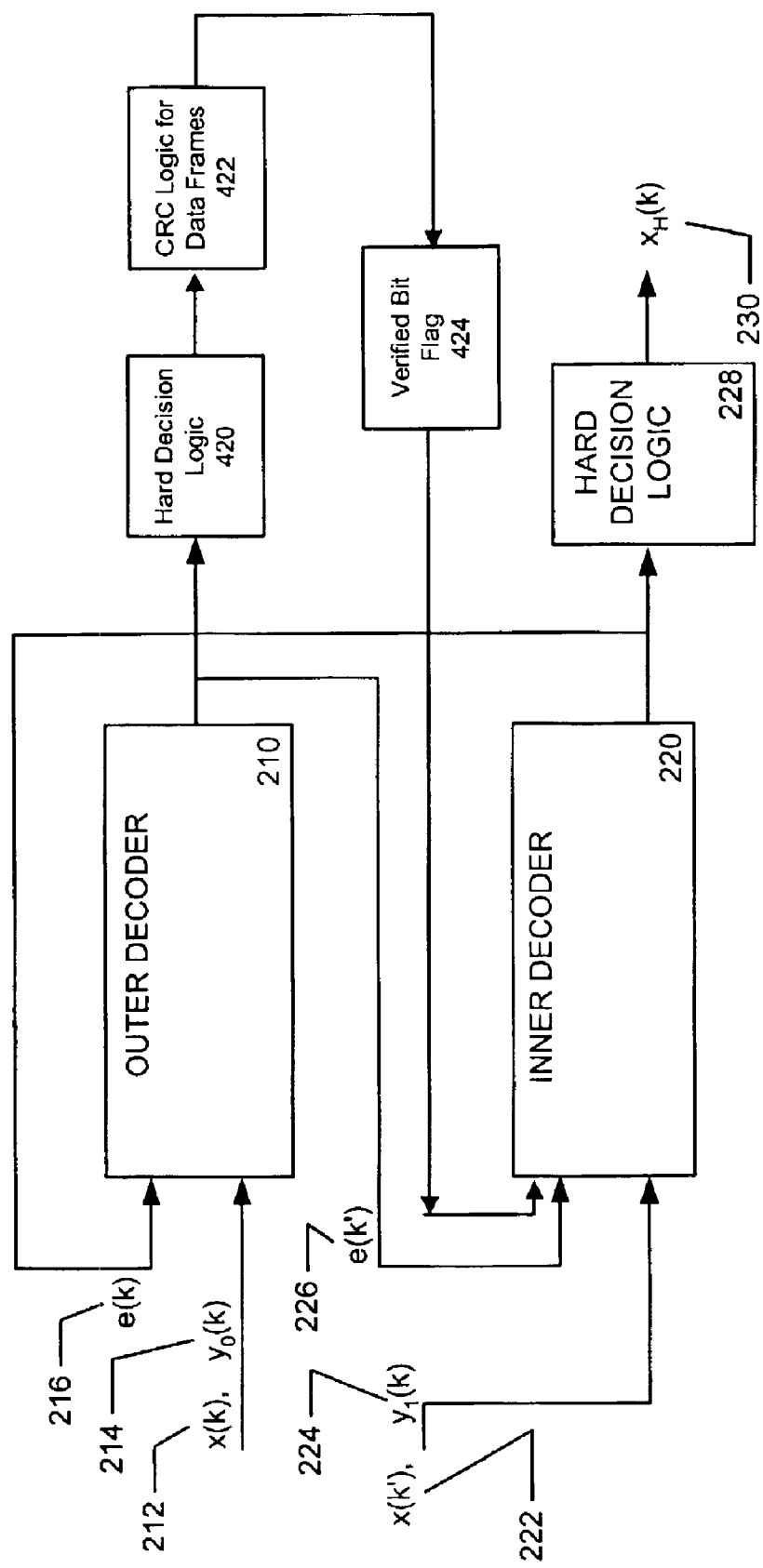
FIG. 4A illustrates the turbo decoder of the present invention

Referring to FIG. 4A the turbo decoder using verified bits is illustrated. The structure and function of the decoder elements of the present invention is similar to that described in FIG. 2. However, in the present invention a CRC for each data frame is established and known to the outer decoder 210. Hard decision logic 420 is used to process the data frame having the established CRC from outer decoder 210. The processed data frame is then checked out by CRC logic 422. IF the data frame checks out a "verified bit" flag is set 424 before passing the data fame to decoder 220. Since this data frame is verified, inner decoder 220 need not perform any further operations on this data frame thereby speeding the entire process.

Figure 4B:
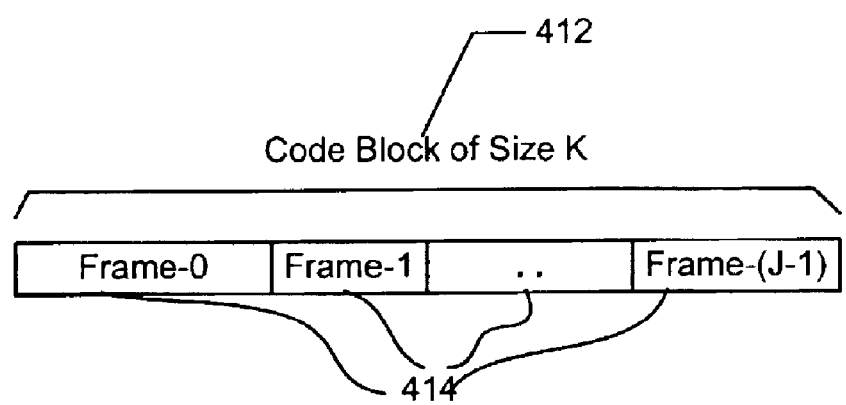
FIG. 4B illustrates a turbo code block of size K made of J data frames.

Referring to FIG. 4B, a turbo code block of size K 412 and made of J data frames 414 is illustrated. The CRC check is performed in the outer decoder. If, after several iterations of turbo decoding, at least one data frame is checked out to be error-free then the data bits in error-free data frames can be considered to be "verified" bits and the nodes entered with verified bits in a code trellis as "bound" nodes.

Figure 5:
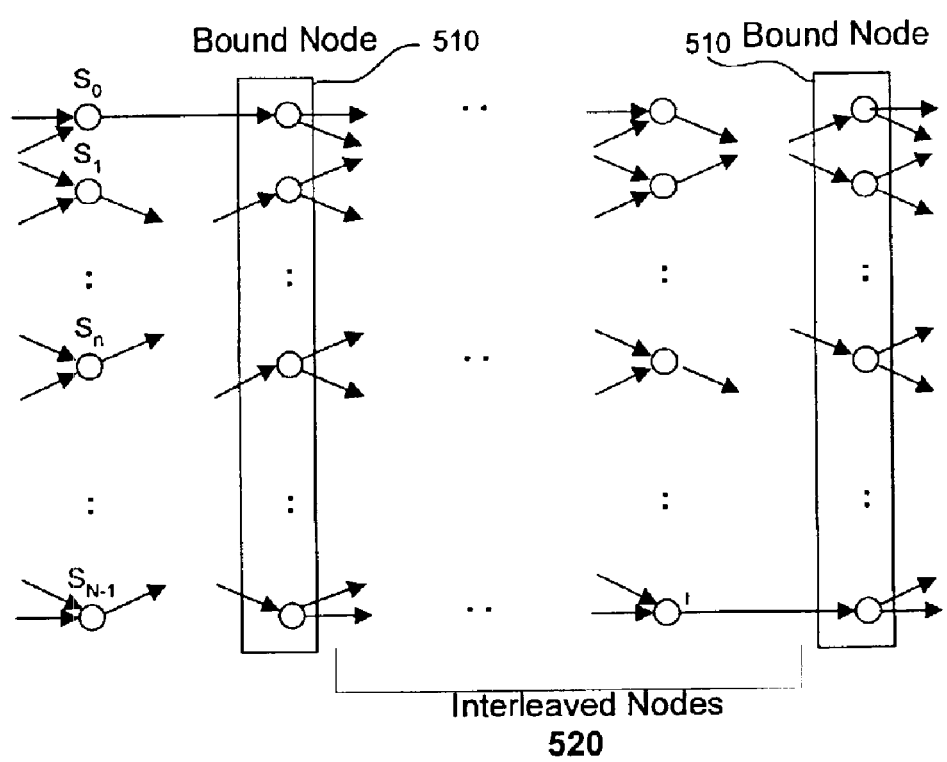
FIG. 5 illustrates a state transition to bound nodes.

In the inner decoder the presence of verified bits is exploited by the present invention to enhance state metrics to and from the bound nodes. Referring to FIG. 5, a state transition to bound nodes is illustrated. Note that in the inner decoder bound nodes 510 are interspersed over the code block due to the turbo interleaver function as depicted in FIG. 5. Interleaved nodes 520 are positioned between bound nodes 510. Denoting state transitions as s' to s when caused by $u(k) = +1$ and s" to s by $u(k) = -1$ where $u(k)$ represents a possible information bit, only one transition is valid when the transition is made to a bound node. By assigning $-\infty$ to branch metrics for invalid state transitions, state metrics can be enhanced at the bound nodes.

Specifically, forcing branch metrics to bound nodes as:

$BM^+(k, s) = -\infty$ if s' to s transition is not a valid transition or $BM^-(k, s) = -\infty$ if s" to s transition is not a valid transition, the recursion formulas of forward and backward state metrics at the bound nodes can be described as:

Forward Recursion $$SM_f(k, s) = \lambda(SM_f^+(k, s), -\infty) = \lambda(SM_f^+(k, s)) \text{ if } s'' \text{ to } s \text{ transition is invalid}$$

$$SM_f(k, s) = \lambda(-\infty, SM_f^-(k, s)) = \lambda(SM_f^-(k, s))) \text{ if } s' \text{ to } s \text{ transition is invalid.}$$

Backward Recursion $$SM_b(k, s) = \lambda(SM_b^+(k, s), -\infty) = \lambda(SM_b^+(k, s)) \text{ if } s'' \text{ to } s \text{ transition is invalid}$$

$$SM_b(k, s) = \lambda(-\infty, SM_b^-(k, s)) = \lambda(SM_b^-(k, s)) \text{ if } s' \text{ to } s \text{ transition is invalid.}$$

Suppose that the node adjacent to a bound node is not bound. Then the generation of extrinsic information at the unbound node will be based on enhanced state metrics at the bound node. In other words the presence of an adjacent bound node limits the possible transition metrics open to the unbound node because certain state transitions become impossible and conversely certain other metrics become more likely.

In simulation it is confirmed that this scheme is particularly effective when the receive channel is very noisy. In noisy channel conditions that normally require more than 12 iterations the scheme described above reduces the number of iterations by 20% to 40% typically.

In another embodiment of the present invention the stop condition for iteration can be unambiguously defined. That is, the iteration simply stops when all of the individual data frames are checked out to be error-free, i.e., all the nodes are bound. In this way no unnecessary iterations need to be performed.

A further embodiment of the present invention addresses the situation when the code block size of a turbo code is not large enough to contain all the data frames from the application modules. In this situation, data bits are unframed or partially framed when processed by the encoder. When the decoder processes the encoded data, there is no CRC analysis because the bits are unframed or come from a partial data frame. The bits in the unframed portion of the data cannot be verified using CRC analysis.

Figure 6:
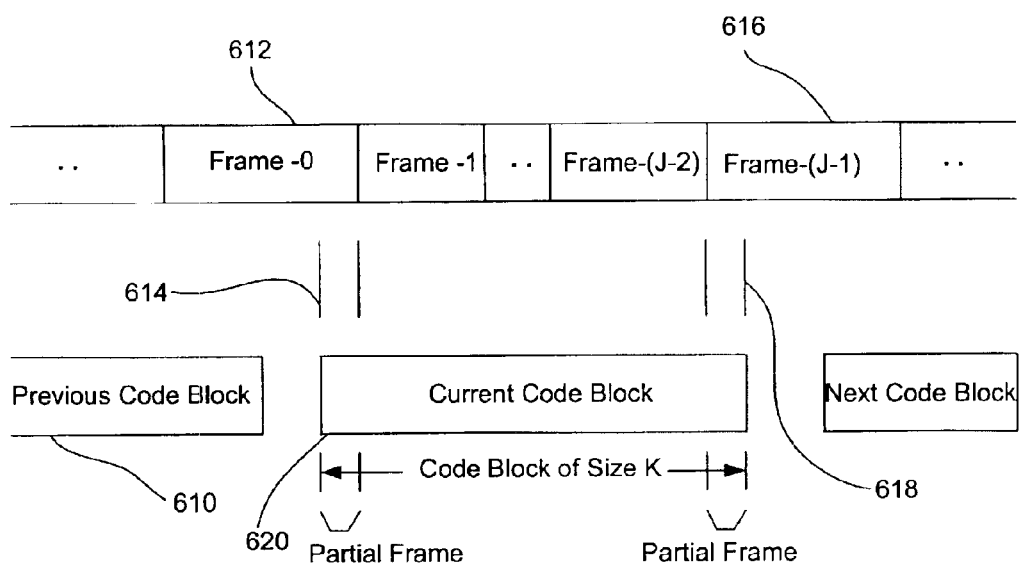
FIG. 6 illustrates a code block with partial data frames.

Referring to FIG. 6, a code block with partial data frames is illustrated. As depicted, data frames get split at code block boundaries. "Previous code block" 610 includes some, but not all of Frame-0 612. A portion 614 of data Frame-0 612 is included in "Current Code Block" 620. Similarly, a portion 618 of data Frame-(J–1) 616 is not in the current code block 620. In this case the setting of the stop condition for iteration is no longer straightforward and it requires some sort of estimation of confidence levels on bits that cannot be checked against bit errors using the quality of extrinsic information.

This further embodiment of the present invention provides a limited bit error detection capability on unframed data bits. When incorporated to existing stop conditions, this scheme augments the effectiveness of the stop condition. In this bit error detection scheme, a local encoder is employed and the local encoder reconstructs the encoder states with decoded bits until it reaches the final node. In the absence of bit errors tail bits are decoded correctly. If the final state of the local encoder were So, the decoder would correctly show a final node state as So. If there were bit errors introduced in the transmission, then there is no guarantee that the final node state is correctly represented after decoding.

Figure 1:
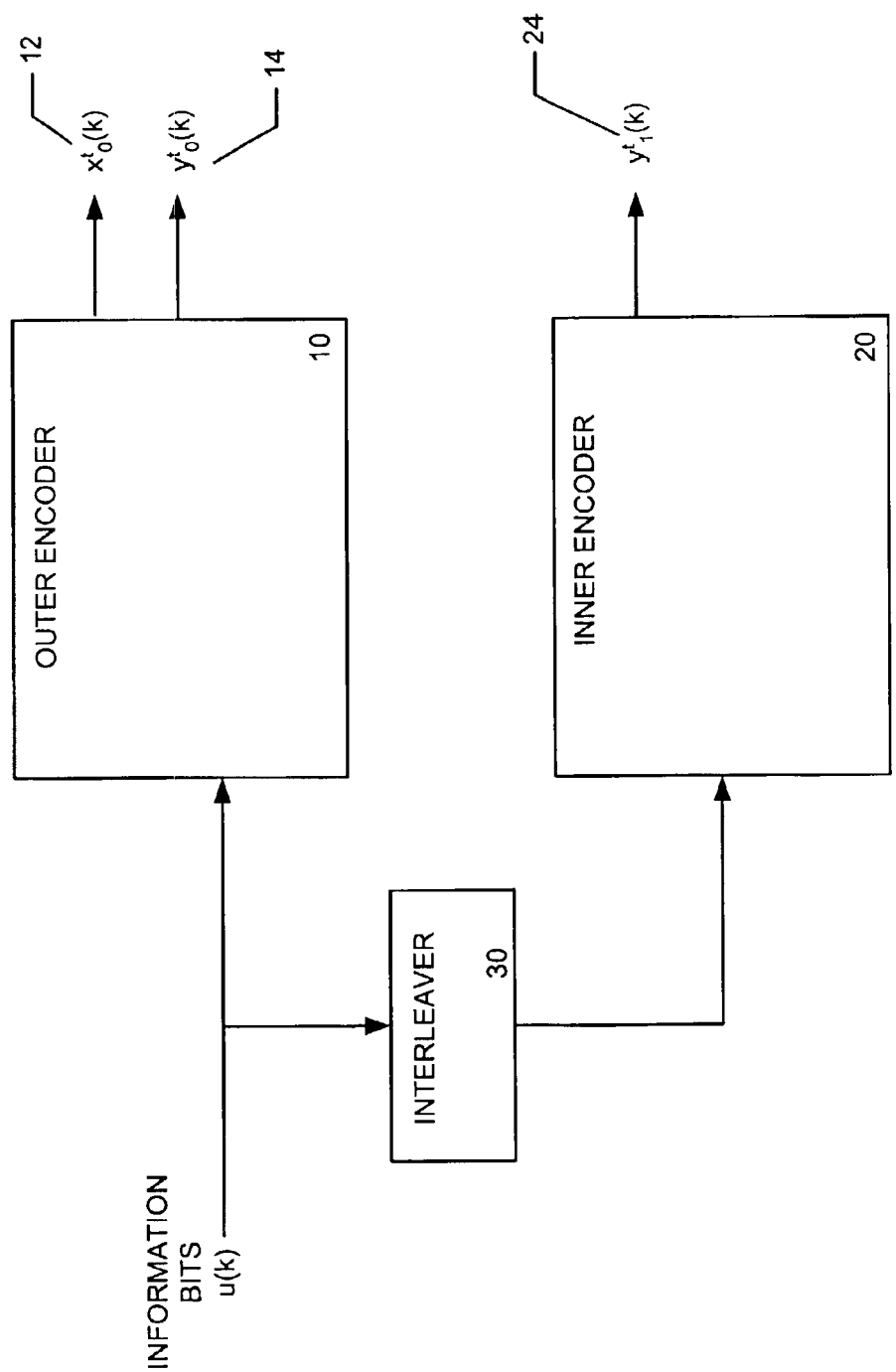
FIG. 1 illustrates an example of turbo encoder with rate 1/3.

Many practical constituent encoders employed in turbo codes such as the one shown in FIG. 1 have the property that the final state of the local encoder reconstructed with decoded bits is always different from the preset state in the presence of a single bit error. In the presence of multiple bit errors, however, there is no guarantee that the final state of the local encoder would be different from the preset state.

One embodiment of the present invention provides reliable decoding of tail bits using a Viterbi algorithm. During backward recursion starting from the final node, a surviving path is selected for each state and a traceback bit indicating the surviving path is stored in the buffer. For reliable decoding of tail bits, traceback bits need to be buffered over the span of at least 5 times the constraint length of the constituent encoder. Specifically, a traceback bit is defined as:

$$+1 \text{ if } SM_b^+(k, s) \leq SM_b^-(k, s), -1 \text{ otherwise}$$

where $$SM_b^+(k, s) = SM_b(k+1, s') + BM^+(k+1, s')$$

$$SM_b^-(k, s) = SM_b(k+1, s'') + BM^-(k+1, s'').$$

Once a sufficient number of trellis nodes are processed, the traceback operation can be initiated from any state of the last node processed. Traceback operation is performed by reading a traceback bit of the current state and tracing back to the previous state using the traceback bit until it reaches the final node. Tail bits are then obtained by taking the traceback bits of the tail section of the code trellis.

When coupled with other criteria, this embodiment significantly increases the effectiveness of the stop condition. Note that this scheme can be applied to the inner decoder as well for further improvement of its error detection capability.

An acceleration of convergence rate and recognition of a stop condition for turbo decoding has now been illustrated.

Further, a reconstruction of a terminal node status has been illustrate where an encoded data block is unframed or contains a partial data frame. It will also be understood that the invention may be embodied in other specific forms without departing from the scope of the invention disclosed. The present examples and embodiments are in all respects illustrative and not restrictive, and the invention is not to be limited to the details given herein. Those skilled in the art of the present invention will recognize that other embodiments using the concepts described herein are also possible.

What is claimed is:

1. A method of accelerating the convergence rate of a turbo decoder comprising:

receiving an encoded data block at the turbo decoder, wherein the encoded data block comprises frames and wherein a frame comprises bits;

decoding a frame;

determining whether the decoded frame comprises bit errors;

if the decoded frame does not comprise bit errors, then identifying the bits as verified bits;

if the decoded frame comprises bit errors, then identifying the bits as unverified bits;

representing the possible states of the turbo decoder as nodes on a code trellis, wherein each node comprises a state metric;

identifying a node on the code trellis entered by a verified bit as a bound node and a node entered by an unverified bit as an unbound node;

enhancing the state metric of a bound node by identifying invalid transition states to and from the bound node;

generating extrinsic information at the unbound node based on the enhanced state metric of an adjacent bound node adjacent to the unbound node, wherein the extrinsic information precludes invalid transition states; and terminating the decoding of the encoded data block when each node of the code trellis is bound.

2. The method as in claim 1, wherein decoding the frames comprises applying a logarithmic maximum a posterori algorithm to each frame.

3. The method as in claim 1 wherein determining whether the decoded frame comprises bit errors comprises:

accessing cyclic redundancy check (CRC) parameters for each decoded frame within the encoded data block;

determining whether the decoded frame meets the CRC parameters;

if the decoded frame satisfies the CRC parameters, then determining that the decode frame does not comprise bit errors; and if the decoded frame does not satisfy the CRC parameters, then determining that the decode frame comprises bit errors.

* * * * *